(12) United States Patent
Ting et al.

(10) Patent No.: US 12,224,226 B2
(45) Date of Patent: Feb. 11, 2025

(54) ELECTRONIC DEVICE

(71) Applicant: InnoLux Corporation, Miao-Li County (TW)

(72) Inventors: Chin-Lung Ting, Miao-Li County (TW); Chung-Kuang Wei, Miao-Li County (TW); Cheng-Chi Wang, Miao-Li County (TW); Yeong-E Chen, Miao-Li County (TW); Yi-Hung Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 205 days.

(21) Appl. No.: 17/898,410

(22) Filed: Aug. 29, 2022

(65) Prior Publication Data

US 2023/0245949 A1    Aug. 3, 2023

(30) Foreign Application Priority Data

Jan. 28, 2022   (CN) .......................... 202210103751.0

(51) Int. Cl.
| | |
|---|---|
| *H05K 1/02* | (2006.01) |
| *H01L 23/00* | (2006.01) |
| *H01L 23/44* | (2006.01) |
| *H01L 23/498* | (2006.01) |
| *H01L 25/065* | (2023.01) |
| *H01L 25/075* | (2006.01) |

(52) U.S. Cl.
CPC ........ *H01L 23/44* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/0655* (2013.01); *H01L 25/0753* (2013.01); *H05K 1/0209* (2013.01); *H01L 2224/16227* (2013.01); *H01L 2224/16238* (2013.01); *H01L 2224/32225* (2013.01); *H01L 2224/73204* (2013.01); *H01L 2924/12041* (2013.01); *H05K 2201/064* (2013.01)

(58) Field of Classification Search
CPC .................................................. H05K 1/0209
See application file for complete search history.

(56) References Cited

U.S. PATENT DOCUMENTS

| | | | |
|---|---|---|---|
| 8,659,898 | B2 | 2/2014 | Brunschwiler |
| 10,192,810 | B2 | 1/2019 | Karhade |
| 10,548,240 | B1 | 1/2020 | Iyengar |
| 2010/0290193 | A1 | 11/2010 | Liu |

(Continued)

FOREIGN PATENT DOCUMENTS

| | | |
|---|---|---|
| CN | 104253115 B | 9/2018 |
| EP | 0 637 078 A1 | 2/1995 |

(Continued)

*Primary Examiner* — Sherman Ng
(74) *Attorney, Agent, or Firm* — Winston Hsu

(57) ABSTRACT

An electronic device is disclosed. The electronic device includes a circuit layer, an electronic element and a thermal conducting element. The electronic element is disposed on the circuit layer and electrically connected to the circuit layer. The thermal conducting element is disposed between the circuit layer and the electronic element. The thermal conducting element is used for performing heat exchange with the electronic element.

18 Claims, 10 Drawing Sheets

(56) References Cited

U.S. PATENT DOCUMENTS

| | | | |
|---|---|---|---|
| 2012/0122278 A1* | 5/2012 | Lee | H01L 24/83 |
| | | | 257/E21.705 |
| 2012/0126401 A1 | 5/2012 | Lin | |
| 2019/0267307 A1* | 8/2019 | Lin | H01L 23/3737 |
| 2020/0243467 A1 | 7/2020 | Prevatte | |
| 2021/0050288 A1* | 2/2021 | Wang | H01L 21/4857 |
| 2021/0287962 A1* | 9/2021 | Huang | H01L 24/83 |
| 2021/0287999 A1* | 9/2021 | Min | H01L 23/3185 |

FOREIGN PATENT DOCUMENTS

| | | |
|---|---|---|
| EP | 0 926 730 A2 | 6/1999 |
| EP | 0 926 730 A3 | 3/2001 |
| TW | 200612533 | 4/2006 |
| TW | 201010030 A1 | 3/2010 |
| TW | I347660 | 8/2011 |
| TW | I431735 B | 3/2014 |
| TW | I724620 B | 4/2021 |

* cited by examiner

ELECTRONIC DEVICE

BACKGROUND OF THE DISCLOSURE

1. Field of the Disclosure

The present disclosure relates to an electronic device, and more particularly to an electronic device which improves heat dissipation of an electronic element.

2. Description of the Prior Art

In recent years, due to the miniaturization and high density of electronic elements in electronic devices, various packaging technologies of electronic elements have been developed. In the conventional packaging technology, the electronic element is electrically connected to a metal layer through bumps or contacts, so as to achieve the electrical connection of circuits, and the function of heat dissipation is achieved at the same time. However, according to the above design, the heat dissipation area is small, resulting in poor heat dissipation efficiency.

SUMMARY OF THE DISCLOSURE

One of the objectives of the present disclosure is to provide an electronic device to solve the problems encountered by the conventional electronic device, thereby improving the heat transfer efficiency or heat dissipation efficiency of the electronic device.

An embodiment of the present disclosure provides an electronic device. The electronic device includes a circuit layer, an electronic element and a thermal conducting element. The electronic element is disposed on the circuit layer and electrically connected to the circuit layer. The thermal conducting element is disposed between the circuit layer and the electronic element. The thermal conducting element is used for performing heat exchange with the electronic element.

An embodiment of the present disclosure provides an electronic device. The electronic device includes a circuit layer, a connection pad and an electronic element. The connection pad is disposed on the circuit layer. The electronic element is disposed on the circuit layer and electrically connected to the circuit layer. The electronic element includes a plurality of connectors, and the plurality of connectors are electrically connected to the connection pad.

An embodiment of the present disclosure provides an electronic device. The electronic device includes a circuit layer, an electronic element, a first flow-path structure and a fluid material. The electronic element is disposed on the circuit layer and electrically connected to the circuit layer. The first flow-path structure includes a first flow path, and the electronic element is disposed in the first flow-path structure. The fluid material is disposed in the first flow path. The fluid material is used for performing heat exchange with the electronic element.

These and other objectives of the present disclosure will no doubt become obvious to those of ordinary skill in the art after reading the following detailed description of the embodiment that is illustrated in the various figures and drawings.

DETAILED DESCRIPTION

Figure 1:
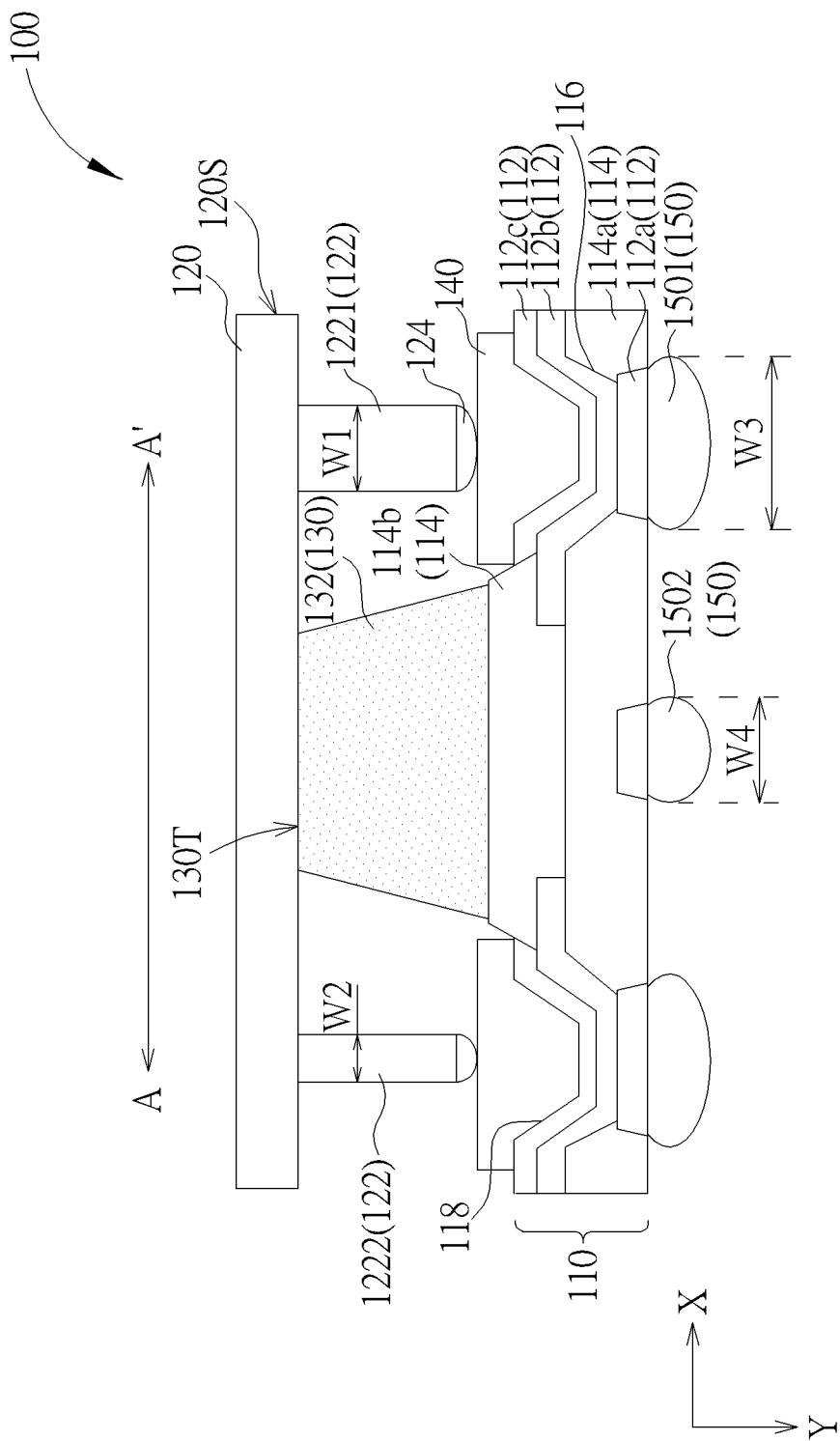
FIG. 1 is a partial cross-sectional schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of the present disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When a component or layer is referred to as being "on" or "connected to" another component or layer, it may be directly on or directly connected to the other component or layer, or intervening components or layers may be presented (indirect condition). In contrast, when a component or layer is referred to as being "directly on" or "directly connected to" another component or layer, there are no intervening components or layers presented.

The directional terms mentioned in this document, such as "up", "down", "front", "back", "left", "right", etc., are only directions referring to the drawings. Therefore, the directional terms used are for illustration, not for limitation of the present disclosure. In the drawings, each drawing shows the general characteristics of structures and/or materials used in specific embodiments. However, these drawings should not be interpreted as defining or limiting the scope or nature covered by these embodiments. For example, the relative size, thickness and position of each layer, region and/or structure may be reduced or enlarged for clarity.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may include a display device, a backlight device, an antenna device, a sensing device or a tiled device, but not limited herein. The electronic device may include a bendable or flexible electronic device. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The tiled device may be, for example, a display tiled device or an antenna tiled device, but not limited herein. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Figure 2A:
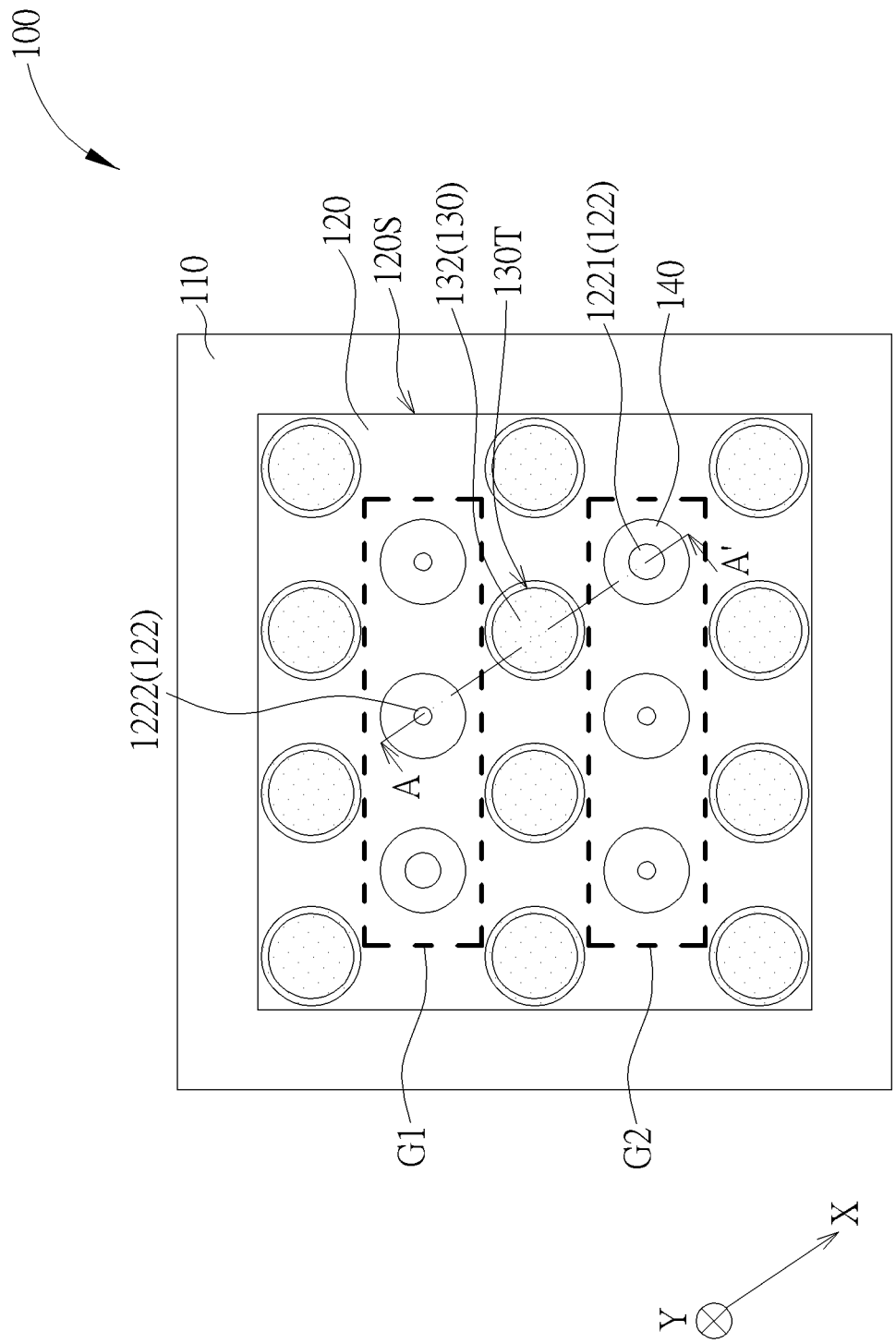
FIG. 2A is a top-view perspective schematic diagram of the electronic device according to the first embodiment of the present disclosure.

Please refer to FIG. 1 and FIG. 2A. FIG. 1 is a partial cross-sectional schematic diagram of an electronic device according to a first embodiment of the present disclosure. FIG. 2A is a top-view perspective schematic diagram of the electronic device according to the first embodiment of the present disclosure, that is, a perspective schematic diagram viewed from the top of the electronic device along a direction Y, wherein FIG. 1 is a partial cross-sectional schematic diagram along the section line A-A' of FIG. 2A. As shown in FIG. 1 and FIG. 2A, an electronic device 100 according to a first embodiment of the present disclosure may include a circuit layer 110, an electronic element 120 and a thermal conducting element 130. The circuit layer 110 may include a plurality of conductive layers 112 and a plurality of insulating layers 114 stacked in the direction Y. For example, the circuit layer 110 may include a conductive layer 112a, a conductive layer 112b, a conductive layer 112c, an insulating layer 114a and an insulating layer 114b, but not limited herein. In this embodiment, the circuit layer 110 may be a redistribution layer (RDL) for redistributing the circuit. For example, the contact positions of the circuit may be changed through one or more metal wiring processes and a connection pad process, but not limited herein. That is to say, the positions of an input terminal (e.g., the connection pad) and an output terminal (e.g., the conductive elements) may be adjusted, such as changed from a position A to a position B, wherein the through hole of the position A is not overlapped with the through hole of the position B. Alternatively, the wiring may be adjusted, such as integrating the signals or integrating two signal lines into one signal line, but not limited herein. In the present disclosure, the direction Y may be a top-view direction of the electronic device, a direction X may be substantially parallel to the horizontal direction, that is, parallel to a surface of the electronic element 120, and the direction Y may be substantially perpendicular to the direction X. The electronic element 120 is disposed on the circuit layer 110 and electrically connected to the circuit layer 110. The electronic element 120 may be, for example, a die, a chip, an integrated circuit (IC), a light-emitting unit or other suitable active elements and/or passive elements, but not limited herein.

The thermal conducting element 130 is disposed between the circuit layer 110 and the electronic element 120, and the thermal conducting element 130 is used for performing heat exchange with the electronic element 120, so as to improve the heat transfer efficiency or heat dissipation efficiency of the electronic device 100. The term "heat exchange" in the present disclosure may refer to existing energy transfer. For example, the thermal energy of the electronic element 120 may be transferred to the circuit layer 110 through the thermal conducting element 130, or the thermal energy of the circuit layer 110 may be transferred to the electronic element 120 through the thermal conducting element 130, but not limited herein. In some embodiments, the thermal conducting element 130 may include thermal conductive material. The "thermal conductive material" in the present disclosure may be, for example, a material with a thermal conductivity greater than 0.4 watts per meter-kelvin (W/(m·K)). The thermal conductive material includes, for example, pouring sealant, silicone paste, silicone grease, thermal conductive mud, a silicone sheet, thermal conductive tape, heat dissipation oil, thermal conductive coating, plastic, a thermal conductive film, insulating material, interface material, double-sided tape, a thermal conductive and heat dissipation substrate, phase-change material, a heat dissipation film, a mica sheet, a pad, tape, a liquid metal thermal conductive sheet, metal material, conductive material, other suitable materials or combinations of the above materials, but not limited herein.

In some embodiments, as shown in FIG. 1 and FIG. 2A, the electronic device 100 of the present disclosure may further include a connection pad 140. The connection pad 140 is disposed on the circuit layer 110 and electrically connected to the circuit layer 110. Furthermore, the electronic element 120 may include a plurality of connectors 122, and the plurality of connectors 122 are electrically connected to the connection pad 140. The connectors 122 may be, for example, bumps, but not limited herein. In some embodiments, the electronic element 120 may be fixed to the connection pads 140 on the circuit layer 110 by, for example, a thin quad flat package technology, but not limited herein. In detail, the circuit layer 110 may include a conductive layer 112a, a conductive layer 112b and a conductive layer 112c. The conductive layer 112b is disposed on the conductive layer 112a, and the conductive layer 112c is disposed on the conductive layer 112b. The insulating layer 114 may include one or more connection hole(s) 116, and the conductive layer 112a, the conductive layer 112b and the conductive layer 112c may be electrically connected through the connection hole(s) 116. Grooves 118 may be optionally formed on the surface of a portion of the conductive layer 112c, and a plurality of connection pads 140 are respectively correspondingly disposed in one of the grooves 118 and electrically connected to the conductive layer 112c. For example, each of the connection pads 140 may be at least partially overlapped with each of the grooves 118 in the direction Y, but not limited herein. In addition, each of the connectors 122 of the electronic element 120 may be electrically connected to one of the connection pads 140 through a conductive element 124. The conductive element 124 may be a solder ball, for example. The conductive element 124 may include copper, tin, nickel, gold, lead, other suitable conductive materials or combinations of the above materials, but not limited herein. In some embodiments, the thermal conducting element 130 may include a plurality of thermal conducting portions 132. The plurality of thermal conducting portions 132 may be spaced apart from each other and disposed between the circuit layer 110 and the electronic element 120. As shown in the top view of FIG. 2A, for example, the thermal conducting portion 132 may be disposed between adjacent connection pads 140 or between the connection pad 140 and an edge 120S of the electronic element 120 in the direction X, but not limited herein. A size of the thermal conducting portions 132 may be adjusted according to a size and/or density of the connection pads 140. In FIG. 1, in the direction X, a width of an upper side 130T of the thermal conducting portion 132 is similar to a width of the connection pad 140 as an example. In FIG. 2A, a top area of the thermal conducting portion 132 is similar to an area of the connection pad 140 as an example. However, the size of the thermal conducting portion 132 is not limited herein.

In some embodiments, as shown in FIG. 1 and FIG. 2A, the electronic element 120 includes a plurality of connectors 122, and a size of one connector 1221 of the plurality of connectors 122 is different from a size of another one connector 1222 of the plurality of connectors 122. For example, as shown in FIG. 1, in the direction X, a width W1 of the connector 1221 may be greater than a width W2 of the connector 1222, or as shown in the top view of FIG. 2A, an area of the connector 1221 may be greater than an area of the connector 1222, but not limited herein. In some embodiments, each of the connectors 122 has the same size or different sizes. The connector 122 with larger size (e.g., the connector 1221) may have a higher output wattage or transmission speed, and the connector 122 with smaller size (e.g., the connector 1222) may have a lower output wattage or transmission speed, but not limited herein. In some embodiments, as shown in FIG. 2A, a portion of the plurality of connectors 122 of the electronic element 120 may output the same signal, and another portion of the plurality of connectors 122 of the electronic element 120 may output another signal. For example, the connectors 122 in the first row may output a first signal, which are assorted into a first group G1 as shown in FIG. 2A, the connectors 122 in the second row may output a second signal, which are assorted into a second group G2 in FIG. 2A, and the first signal is different from the second signal. That is to say, the first signal output by the connector 1222 in the second group G2 may be different from the second signal output by the connector 1221 in the first group G1, but not limited herein. The signal output by each of the connectors 122 may be adjusted according to the practical design of the electronic element 120. For example, the signal output by each connector 122 may be independent and different from each other in other embodiments.

In some variation embodiments, the sizes of the connection pads 140 may be different, or the size of the connection pad 140 may correspond to the size of the connector 122. For example, the size of the connection pad 140 corresponding to the connector 1221 may be greater than the size of the connection pad 140 corresponding to the connector 1222, so as to improve the heat transfer efficiency or heat dissipation efficiency, but not limited herein. The size of each of the connection pads 140 may be adjusted according to the practical design of the circuit layer 110. For example, the sizes of the connection pads 140 may be the same in other embodiments.

Figure 2B:
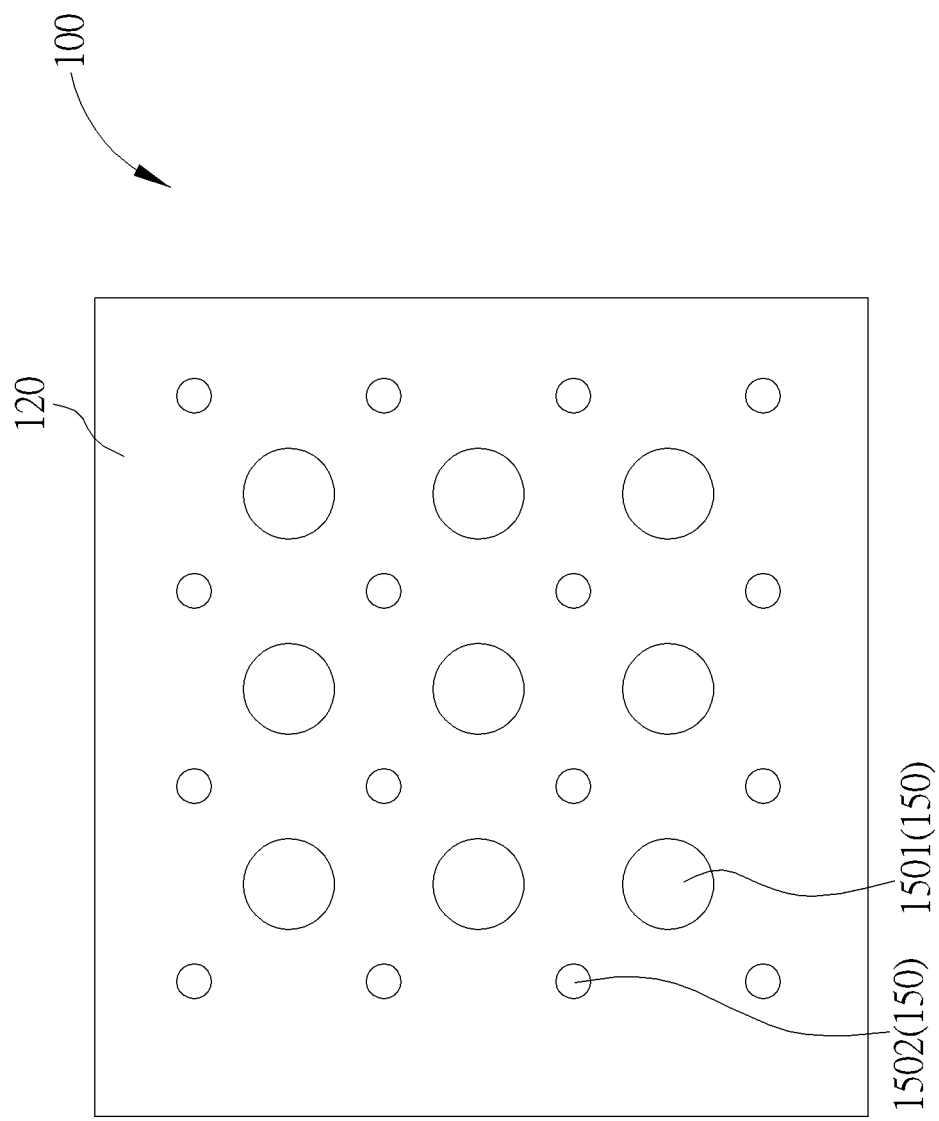
FIG. 2B is a bottom-view schematic diagram of the electronic device according to the first embodiment of the present disclosure.

Please refer to FIG. 1, FIG. 2A and FIG. 2B. FIG. 2B is a bottom-view schematic diagram of the electronic device according to the first embodiment of the present disclosure, that is, a bottom view along a direction opposite to the direction Y. In some embodiment, as shown in FIG. 1, FIG. 2A and FIG. 2B, the electronic device 100 of the present disclosure may further include a plurality of conductive elements 150 disposed on one side of the circuit layer 110 opposite to the electronic element 120. The plurality of conductive elements 150 may be electrically connected to the circuit layer 110, and a portion of the conductive elements 150 may be electrically connected to the electronic element 120 through the circuit layer 110. The conductive elements 150 may be solder balls, for example. The conductive elements 150 may include copper, tin, nickel, gold, lead or other suitable conductive materials, but not limited herein. For example, as shown in FIG. 1, the plurality of conductive elements 150 may be electrically connected to the conductive layer 112a which is the lowest layer in the circuit layer 110, and a portion of the conductive elements 150 may be electrically connected to the connectors 122 of the electronic element 120 via the conductive layer 112a, the conductive layer 112b, the conductive layer 112c and the connection pads 140. In some embodiments, a size of one conductive element 1501 of the plurality of conductive elements 150 may be different from a size of another one conductive element 1502 of the plurality of conductive elements 150, wherein the above sizes may be lengths or thicknesses in the same direction or may be areas viewed from the top. For example, as shown in FIG. 1, in the direction X, a width W3 of the conductive element 1501 may be greater than a width W4 of the conductive element 1502, or as shown in the bottom view of FIG. 2B, an area of the conductive element 1501 may be greater than an area of the conductive element 1502, but not limited herein. In some embodiments, the sizes of the conductive elements 150 may be different, or the size of the conductive element 150 may correspond to the size of the connector 122. For example, the size of the conductive element 150 corresponding to the connector 1221 may be greater than the size of the conductive element 150 corresponding to the connector 1222, so as to improve the heat transfer efficiency or heat dissipation efficiency, but not limited herein.

In some embodiments, the number of the connection pads 140 disposed on one side of the circuit layer 110 may be the same as or different from the number of the conductive elements 150 disposed on the other side of the circuit layer 110 by changing contact positions of the circuit through a metal wiring process and a connection pad process. For example, the number of the connection pads 140 may be less than the number of the conductive elements 150. The number of the connection pads 140 may be 6 as shown in the top view of FIG. 2A, and the number of the conductive elements 150 may be 25 as shown in the bottom view of FIG. 2B, but the number of the connection pads 140 and the number of the conductive elements 150 are not limited herein, which may be adjusted according to the design of practical structure of the device. In other embodiments, the number of the connection pads 140 may be the same as the number of the conductive elements 150, and each of the connection pads 140 is not overlapped with each of conductive elements 150 in the direction Y. In other embodiments, the number of the connection pads 140 may be greater than the number of the conductive elements 150, but not limited herein.

Some embodiments of the present disclosure will be detailed in the following. In order to simplify the illustration, the same elements in the following would be labeled with the same symbols. The differences between different embodiments are described in detail below, and each of the embodiments and another embodiment of the present disclosure may be combined and adjusted with each other.

Figure 3:
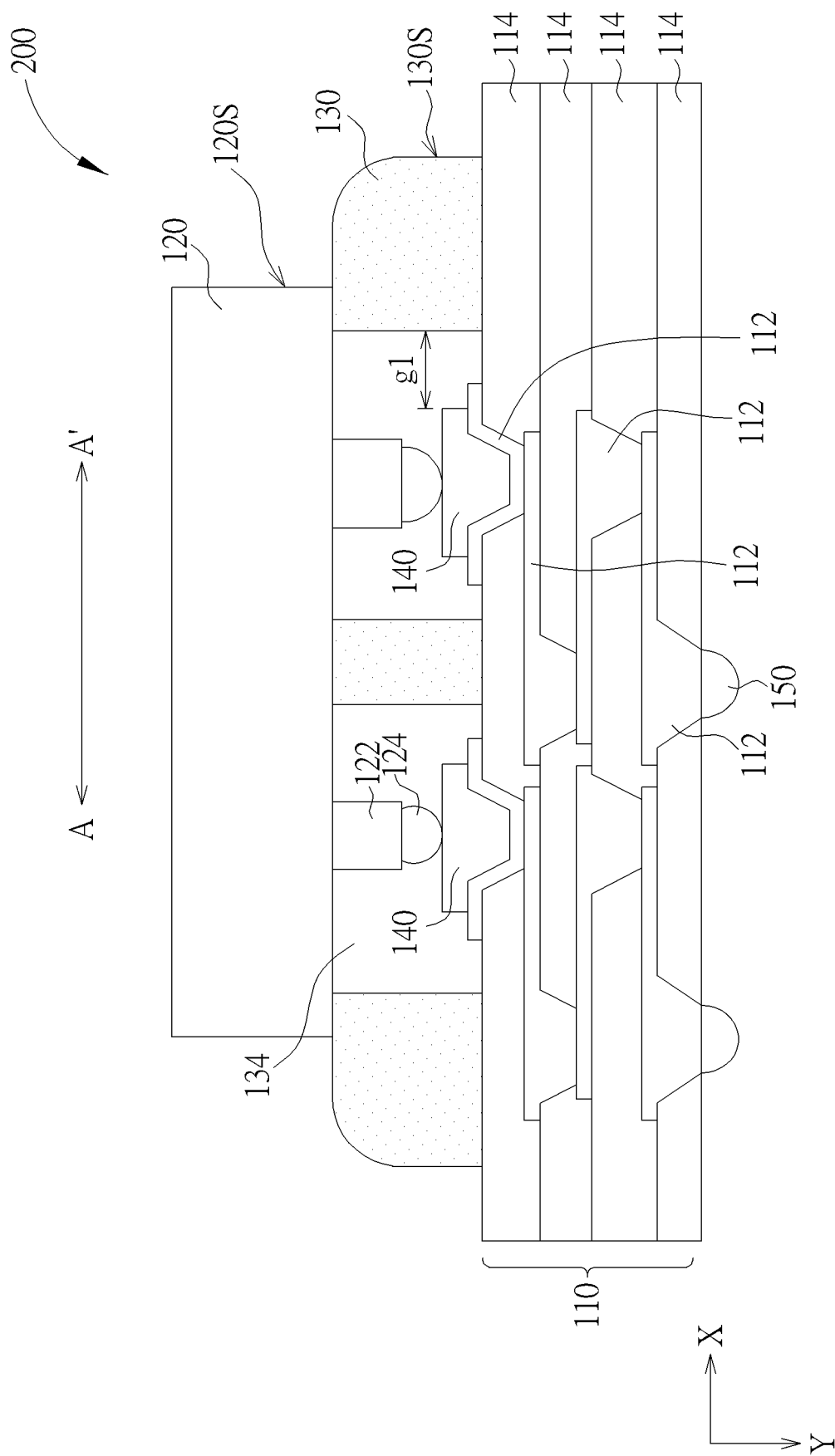
FIG. 3 is a partial cross-sectional schematic diagram of an electronic device according to a second embodiment of the present disclosure.
Figure 4:
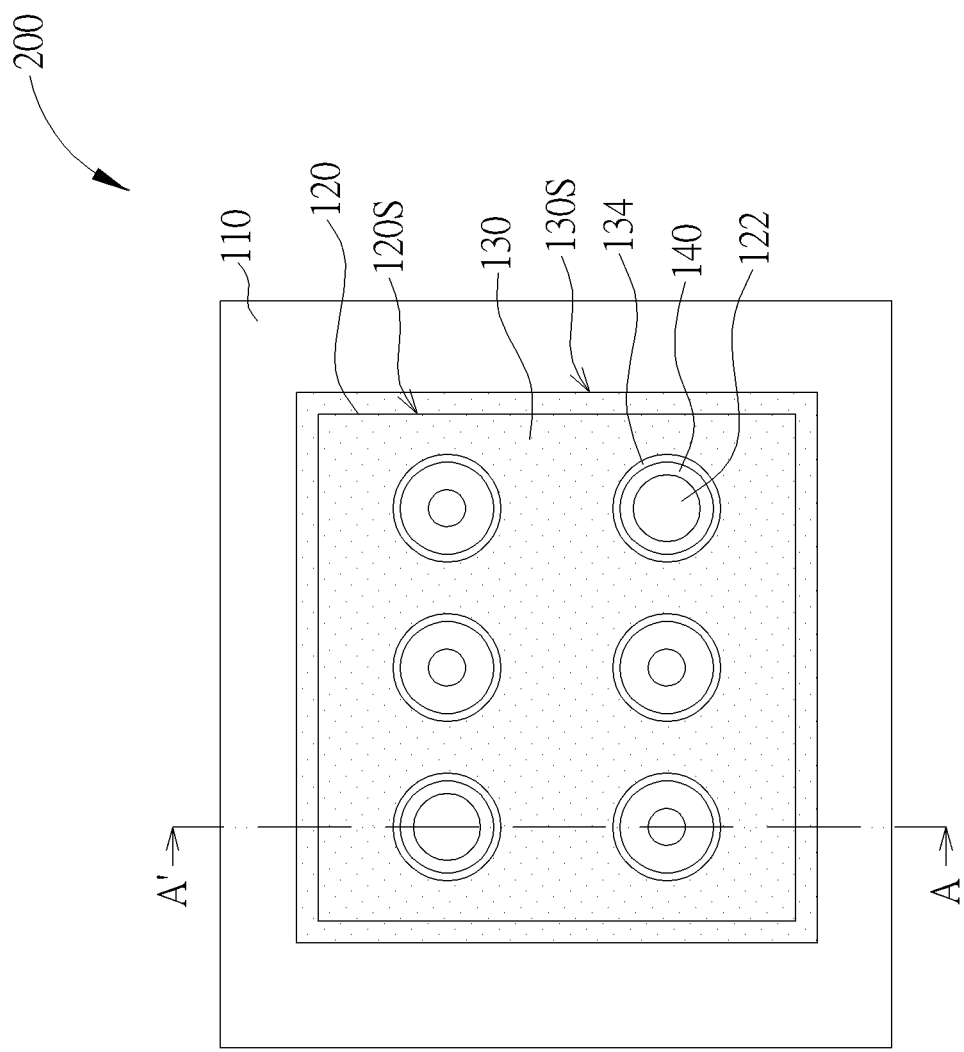
FIG. 4 is a top-view perspective schematic diagram of the electronic device according to the second embodiment of the present disclosure.

Please refer to FIG. 3 and FIG. 4. FIG. 3 is a partial cross-sectional schematic diagram of an electronic device according to a second embodiment of the present disclosure. FIG. 4 is a top-view perspective schematic diagram of the electronic device according to the second embodiment of the present disclosure, that is, a perspective schematic diagram viewed from the top of the electronic device along the direction Y, wherein FIG. 3 is a partial cross-sectional schematic diagram along the section line A-A' of FIG. 4. As shown in FIG. 3 and FIG. 4, an electronic device 200 according to a second embodiment of the present disclosure may include a circuit layer 110, an electronic element 120 and a thermal conducting element 130. The circuit layer 110 may include a plurality of conductive layers 112 and a plurality of insulating layers 114 stacked in the direction Y, and the circuit layer 110 may be a redistribution layer (RDL) to redistribute the circuit. For example, the contact positions of the circuit may be changed through a metal wiring process and a connection pad process, but not limited herein. The electronic element 120 is disposed on the circuit layer 110 and electrically connected to the circuit layer 110, and the electronic element 120 includes a plurality of connectors 122. The thermal conducting element 130 is disposed between the circuit layer 110 and the electronic element 120. The thermal conducting element 130 has a plurality of openings 134, and the plurality of connectors 122 of the electronic element 120 correspond to the plurality of openings 134 of the thermal conducting element 130. For example, each of the plurality of connectors 122 may be at least partially overlapped with each of the plurality of openings 134 in the direction Y, but not limited herein. The thermal conducting element 130 is used for performing heat exchange with the electronic element 120, so as to improve the heat dissipation efficiency of the electronic device 200.

The disposing range of the thermal conducting element 130 may extend beyond a peripheral edge 120S of the electronic element 120, that is, an edge 130S of the thermal conducting element 130 may be more protruding relative to the edge 120S of the electronic element 120. In the top view of FIG. 4, it may be seen that the edge 120S of the electronic element 120 is located in the region constructed by the edge 130S of the thermal conducting element 130. The above design may increase the heat transfer area. For example, through process such as coating, exposure and/or development, the thermal conducting element 130 may be formed on the circuit layer 110, and the plurality of openings 134 may be formed, so as to reserve space for subsequent disposing the plurality of connectors 122 of the electronic element 120 to be electrically connected to the circuit layer 110. The surface of the thermal conducting element 130 may have an arc shape or other irregular shapes, but not limited herein.

In some embodiments, as shown in FIG. 3 and FIG. 4, the electronic device 200 of the present disclosure may further include a plurality of connection pads 140 disposed on the circuit layer 110, and the plurality of connection pads 140 are electrically connected to the conductive layer 112 which is the uppermost layer in the circuit layer 110 and may respectively correspond to one of the openings 134 of the thermal conducting element 130. A gap g1 may exist between each of the plurality of connection pads 140 and the thermal conducting element 130, that is, the thermal conducting element 130 does not directly contact with the connection pads 140, but not limited herein. Furthermore, each of the connectors 122 of the electronic element 120 may be electrically connected to one of the connection pads 140 through a conductive element 124. In some embodiments, the electronic device 200 of the present disclosure may further include a plurality of conductive elements 150 disposed on one side of the circuit layer 110 opposite to the electronic element 120, and the plurality of conductive elements 150 may be electrically connected to the conductive layer 112 which is the lowest layer in the circuit layer 110, but not limited herein.

Figure 5:
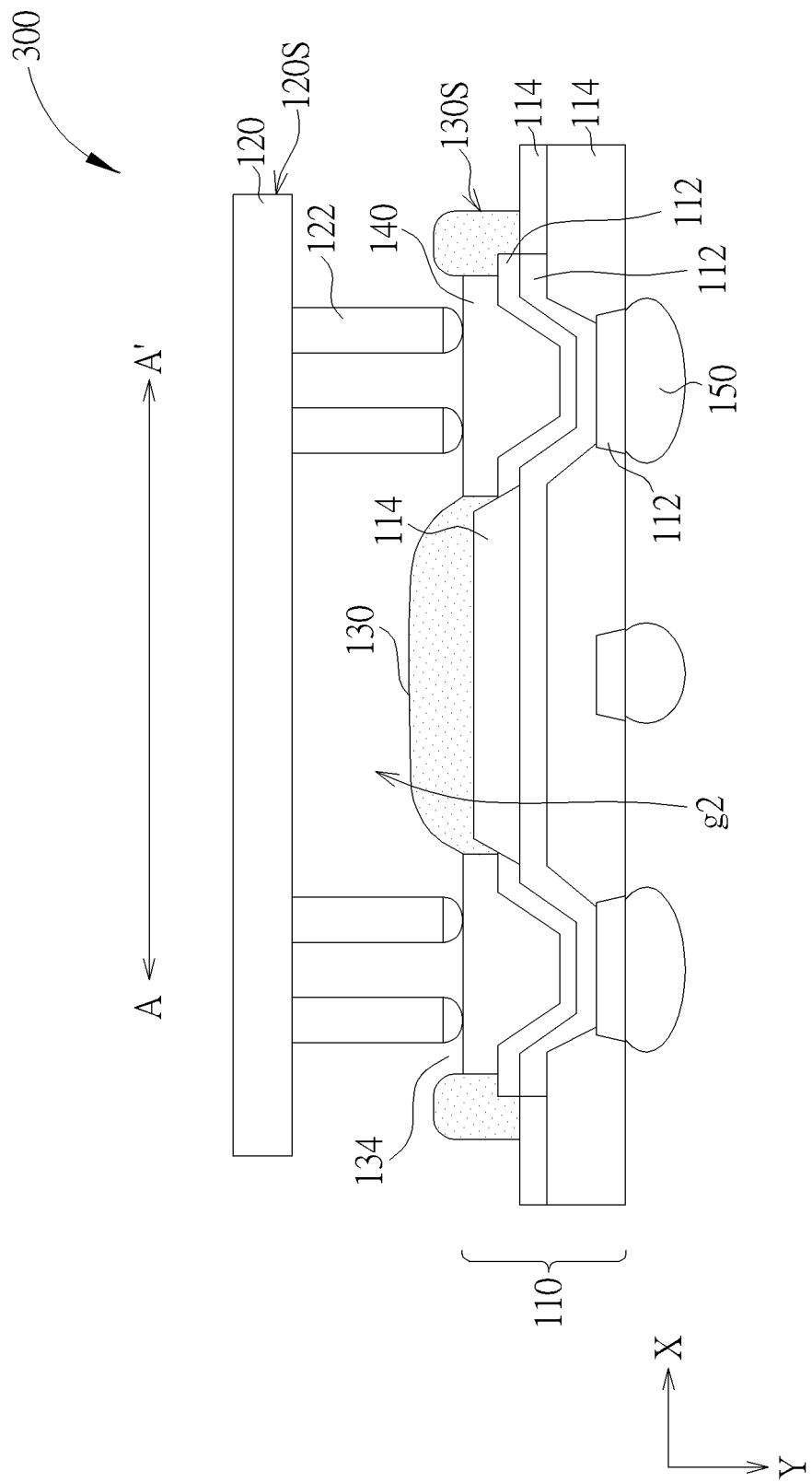
FIG. 5 is a partial cross-sectional schematic diagram of an electronic device according to a third embodiment of the present disclosure.
Figure 6:
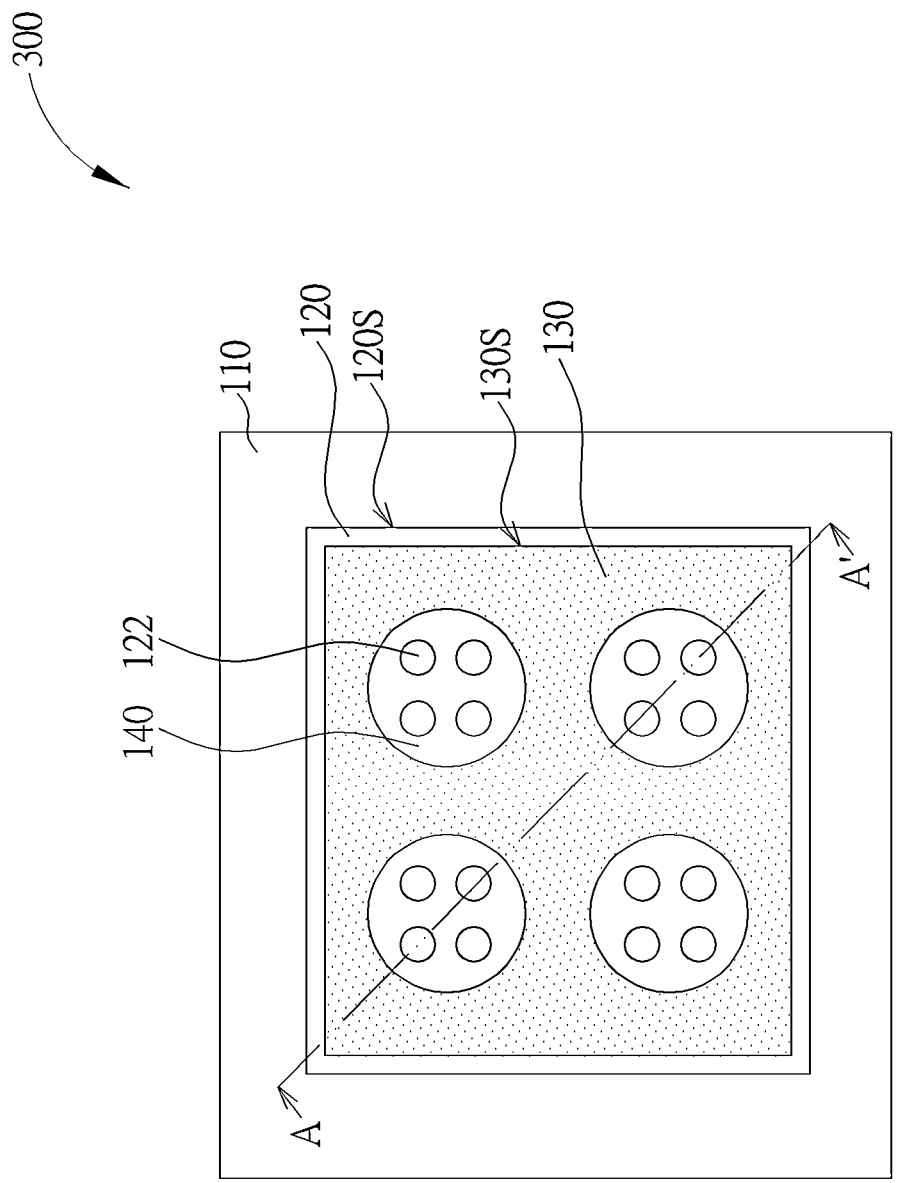
FIG. 6 is a top-view perspective schematic diagram of the electronic device according to the third embodiment of the present disclosure.

Please refer to FIG. 5 and FIG. 6. FIG. 5 is a partial cross-sectional schematic diagram of an electronic device according to a third embodiment of the present disclosure. FIG. 6 is a top-view perspective schematic diagram of the electronic device according to the third embodiment of the present disclosure, that is, a perspective schematic diagram viewed from the top of the electronic device along the direction Y, wherein FIG. 5 is a partial cross-sectional schematic diagram along the section line A-A' of FIG. 6. As shown in FIG. 5 and FIG. 6, an electronic device 300 according to a third embodiment of the present disclosure may include a circuit layer 110, a connection pad 140 and an electronic element 120. The circuit layer 110 may include a plurality of conductive layers 112 and a plurality of insulating layers 114 stacked in the direction Y. The connection pad 140 is disposed on the circuit layer 110, and the electronic element 120 is disposed on the circuit layer 110 and electrically connected to the circuit layer 110. The electronic element 120 includes a plurality of connectors 122, and the plurality of connectors 122 are electrically connected to the connection pad 140, wherein multiple connectors 122 may correspond to the same connection pad 140, so as to increase the heat transfer area, thereby improving the heat transfer efficiency. For example, multiple connectors 122 may be overlapped or partially overlapped with the same connection pad 140 in the direction Y. In FIG. 6, four connectors 122 correspond to one connection pad 140 as an example, but the number of the connectors 122 corresponding to one connection pad 140 is not limited herein, which may be adjusted according to the design of practical structure of the device.

In some embodiment, as shown in FIG. 5 and FIG. 6, the electronic device 300 of the present disclosure may further include a thermal conducting element 130 disposed on the circuit layer 110, and a gap g2 may exist between the thermal conducting element 130 and the electronic element 120 in the direction Y. That is to say, the thermal conducting element 130 does not directly contact with the electronic element 120. The thermal conducting element 130 may have an arc shape or other irregular shapes, but not limited herein. In addition, the disposing range of the thermal conducting element 130 may not extend beyond a peripheral edge 120S of the electronic element 120, that is, an edge 130S of the thermal conducting element 130 is located within the range of the edge 120S of the electronic element 120 in the top view. The thermal conducting element 130 may directly contact with the connection pad 140, that is, no gap exists between the connection pad 140 and the thermal conducting element 130, so as to improve the heat transfer efficiency, but not limited herein. In the embodiment shown in FIG. 5, the connection pad 140 may be located in an opening 134 of the thermal conducting element 130, or the connection pad 140 may be disposed corresponding to the opening 134 of the thermal conducting element 130.

Figure 7:
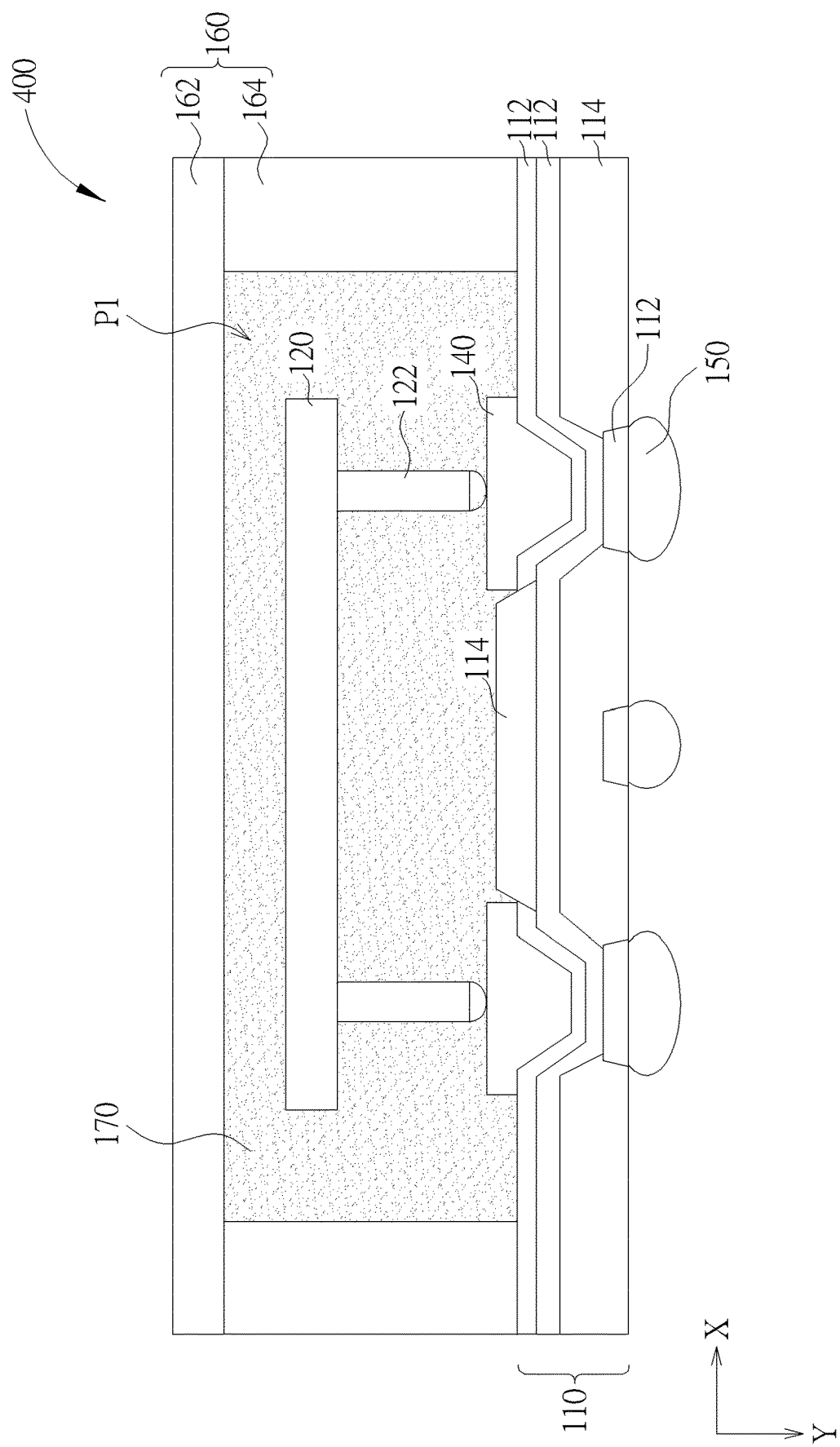
FIG. 7 is a partial cross-sectional schematic diagram of an electronic device according to a fourth embodiment of the present disclosure.

Please refer to FIG. 7. FIG. 7 is a partial cross-sectional schematic diagram of an electronic device according to a fourth embodiment of the present disclosure. As shown in FIG. 7, an electronic device 400 according to a fourth embodiment of the present disclosure may include a circuit layer 110, an electronic element 120, a first flow-path structure 160 and a fluid material 170. The electronic element 120 is disposed on the circuit layer 110 and electrically connected to the circuit layer 110. The first flow-path structure 160 includes a first flow path P1, and the electronic element 120 is disposed in the first flow-path structure 160. The fluid material 170 is disposed in the first flow path P1, and the fluid material 170 is used for performing heat exchange with the electronic element 120, so as to improve the heat dissipation efficiency of the electronic device 400. The first flow path P1 may be a space surrounded by the first flow-path structure 160. The fluid material 170 may include a thermal conductive material of liquid or gas, such as deionized water, thermal conductive silicone grease, refrigerant, acetone, isopropanol, nitrogen, inert gas, other suitable materials or combinations of the above materials, but not limited herein.

Specifically, in some embodiments, the first flow-path structure 160 may include a substrate 162 and a support member 164. The substrate 162 is disposed corresponding to the electronic element 120, and the electronic element 120 is disposed between the substrate 162 and the circuit layer 110. The substrate 162 may be at least partially overlapped with the electronic element 120 in the direction Y. The support member 164 may be disposed at opposite two sides of the electronic element 120 in the direction X. In some embodiments, the support member 164 may be disposed at the periphery of the electronic element 120. For example, the support member 164 may be located at the outer side of the electronic element 120 and annularly surround the electronic element 120, but not limited herein. The first flow-path structure 160 may surround the electronic element 120. For example, the support member 164 is connected to the substrate 162 and the circuit layer 110, so the substrate 162 and the support member 164 may surround the electronic element 120 above the circuit layer 110. Through the above design of the first flow-path structure 160, the first flow path P1 may be formed between the substrate 162, the support member 164 and the electronic element 120, and the fluid material 170 may be disposed in the first flow path P1 for performing heat exchange with the electronic element 120. In some embodiments, the substrate 162 and/or the support member 164 may include thermal conductive materials. For example, the substrate 162 may include metal, graphene, ceramic, thermal conductive silicone, other suitable materials or combinations of the above materials, and the support member 164 may include sealant, but not limited herein. In some embodiments, the first flow-path structure 160 may be a structure formed integrally for surrounding the electronic element 120 and forming the first flow path P1 with the electronic element 120. For example, the substrate 162 and the support member 164 include the same material and may be formed together, but not limited herein.

In some embodiments, as shown in FIG. 7, the circuit layer 110 may include a plurality of conductive layers 112 and a plurality of insulating layers 114 stacked in the direction Y. The connector 122 of the electronic element 120 may be electrically connected to the conductive layer 112 which is the uppermost layer in the circuit layer 110 through the connection pad 140. In addition, the electronic device 400 may further include a plurality of conductive elements 150 disposed on one side of the circuit layer 110 opposite to the electronic element 120, and the plurality of conductive elements 150 may be electrically connected to the circuit layer 110, but not limited herein.

Figure 8:
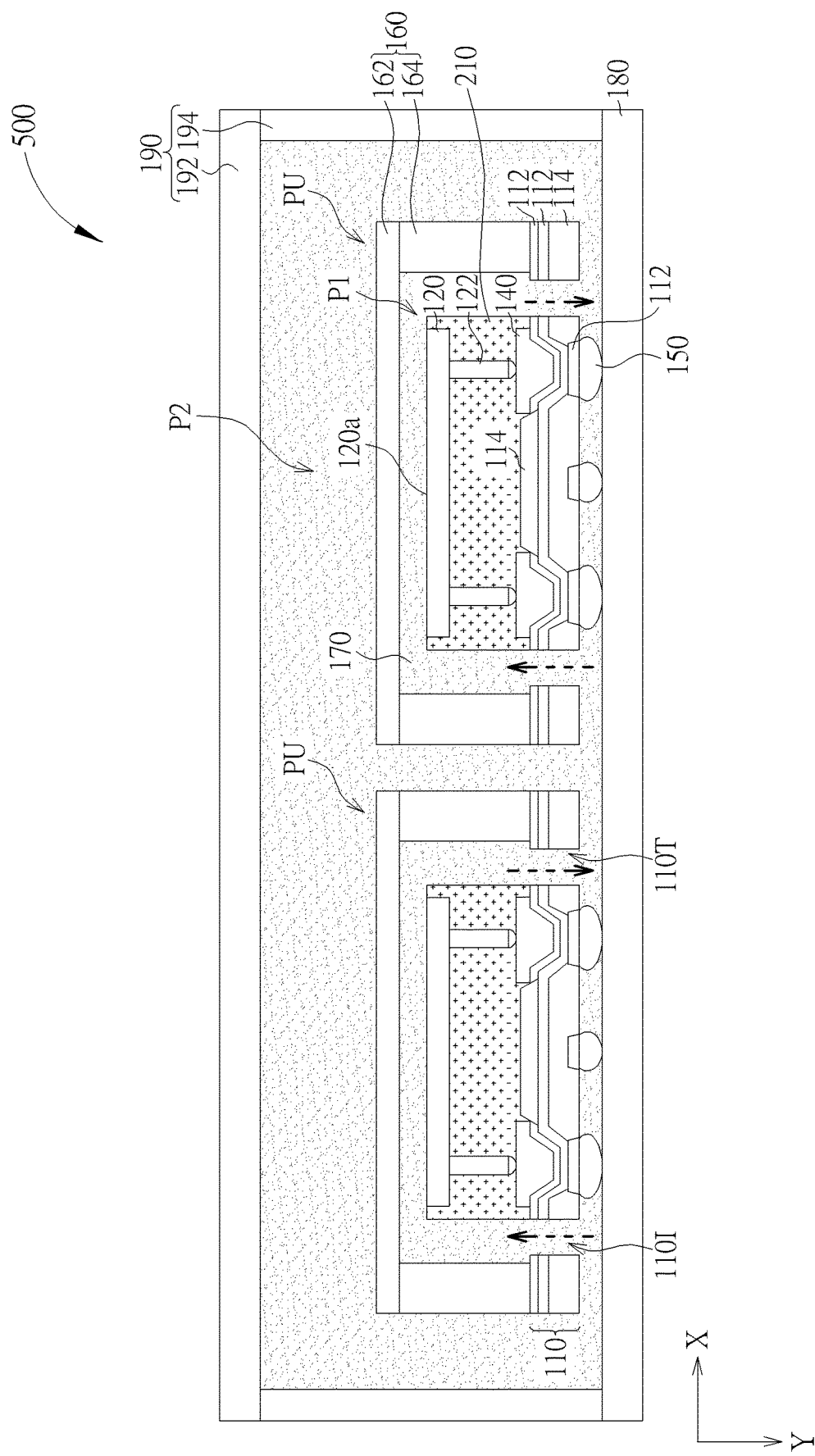
FIG. 8 is a partial cross-sectional schematic diagram of an electronic device according to a fifth embodiment of the present disclosure.

Please refer to FIG. 8. FIG. 8 is a partial cross-sectional schematic diagram of an electronic device according to a fifth embodiment of the present disclosure. As shown in FIG. 8, an electronic device 500 according to a fifth embodiment of the present disclosure may include a circuit layer 110, an electronic element 120, a first flow-path structure 160 and a fluid material 170. The circuit layer 110, the electronic element 120 and the first flow-path structure 160 may constitute a package unit PU, and one electronic device 500 may include a plurality of package units PU, but not limited herein. The electronic element 120 is disposed on the circuit layer 110 and electrically connected to the circuit layer 110. The first flow-path structure 160 includes a first flow path P1, and the electronic element 120 is disposed in the first flow-path structure 160. Furthermore, the circuit layer 110 includes an input hole 110I and an output hole 110T, and the fluid material 170 may enter the first flow path P1 through the input hole 110I and exit the first flow path P1 through the output hole 110T, so that the fluid material 170 may be disposed in the first flow path P1 and exchange heat with the electronic element 120 by a convection method, thereby improving the heat dissipation efficiency of the electronic device 500. Specifically, the input hole 110I and the output hole 110T of the circuit layer 110 may penetrate through the circuit layer 110, and the input hole 110I and the output hole 110T may be respectively adjacent to the opposite two sides of the electronic element 120 when viewed from the top in the direction Y, so that the fluid material 170 in the first flow path P1 may form convection shown by the dotted arrows in FIG. 8, thereby performing heat exchange with the electronic element 120. In some embodiments, the first flow-path structure 160 may include a substrate 162 and a support member 164, and the detail structures and materials thereof may be referred to illustration of the previous embodiments, which will not be described redundantly herein.

In some embodiments, as shown in FIG. 8, the electronic device 500 may further include a circuit board 180 and a second flow-path structure 190. The circuit board 180 is electrically connected to the circuit layer 110. For example, the circuit board 180 may be electrically connected to the circuit layer 110 through a plurality of conductive elements 150, but not limited herein. The circuit board 180 includes, for example, a printed circuit board, but not limited herein. The second flow-path structure 190 is disposed on the circuit board 180 and includes a second flow path P2. The fluid material 170 may be further disposed in the second flow path P2 and surround and cover the package units PU so as to perform heat exchange with the package units PU, and the fluid material 170 may further enter the first flow path P1 through the input hole 110I and exit the first flow path P1 through the output hole 110T, thereby performing heat exchange with the electronic element 120.

In some embodiments, the second flow-path structure 190 may include a substrate 192 and a support member 194. The substrate 192 may be disposed corresponding to a plurality of package units PU, and the plurality of package units PU are disposed between the substrate 192 and the circuit board 180. The substrate 192 may be at least partially overlapped with the plurality of package units PU in the direction Y, or the substrate 192 may cover the plurality of package units PU in the direction Y. The support member 194 may be disposed at opposite two sides of the plurality of package units PU in the direction X. In some embodiments, the support member 194 may be disposed at the outer side of all of the package units PU. For example, the support member 194 may be located at the periphery of all of the package units PU and annularly surround all of the package units PU, but not limited herein. Since the support member 194 is connected to the substrate 192 and the circuit board 180, the substrate 192 and the support member 194 together surround the package units PU disposed between the substrate 192 and the support member 194. Through the above design of the second flow-path structure 190, the second flow path P2 may be formed between the substrate 192, the support member 194 and the package units PU, and the fluid material 170 may be disposed in the second flow path P2 for performing heat exchange with the package units PU and the electronic elements 120 in the package units PU. In some embodiments, the substrate 192 and/or the support member 194 may include thermal conductive materials. For example, the substrate 192 may include metal, graphene, ceramic, thermal conductive silicone, other suitable materials or combinations of the above materials, and the support member 194 may include sealant, but not limited herein. In some embodiments, the second flow-path structure 190 may be a structure formed integrally for surrounding the package units PU and forming the second flow path P2 with the package units PU. For example, the substrate 192 and the support member 194 include the same material and may be formed together, but not limited herein.

In some embodiments, as shown in FIG. 8, the electronic device 500 may optionally include a protective layer 210, and the protective layer 210 covers the plurality of connectors 122 of the electronic element 120. The protective layer 210 may further cover the connection pads 140 and/or surround the periphery of the electronic element 120. The protective layer 210 may include, for example, epoxy, ceramic, other suitable materials or combinations of the above materials, but not limited herein. In other embodiments, the protective layer 210 may not be provided in the electronic device 500. Specifically, each of the package units PU in the electronic device 500 may optionally include a protective layer 210. The protective layer 210 may be disposed on the circuit layer 110, and the protective layer 210 may cover a portion of the surface of the circuit layer 110, the connection pads 140 disposed on the circuit layer 110, the connectors 122 of the electronic element 120 and at least a portion of the surface of the electronic element 120 (e.g., the side surface of the electronic element 120), but not limited herein. In some embodiments, as shown in FIG. 8, an upper surface 120a of the electronic element 120 may be exposed from the protective layer 210, that is, the upper surface 120a of the electronic element 120 is not covered by the protective layer 210. In other embodiments, the protective layer 210 may cover the upper surface 120a of the electronic element 120, but not limited herein.

Figure 9:
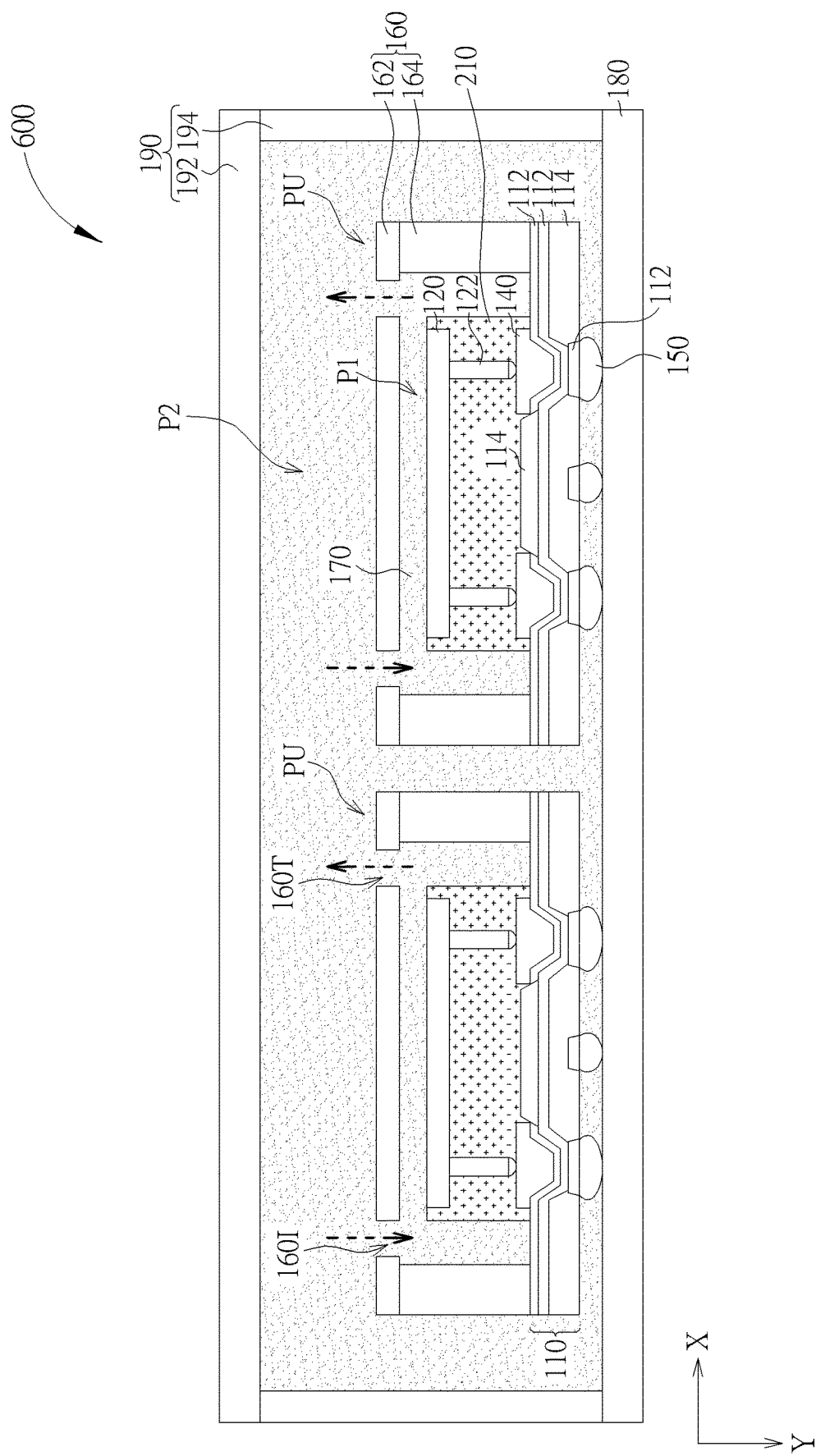
FIG. 9 is a partial cross-sectional schematic diagram of an electronic device according to a sixth embodiment of the present disclosure.

Please refer to FIG. 9. FIG. 9 is a partial cross-sectional schematic diagram of an electronic device according to a sixth embodiment of the present disclosure. As shown in FIG. 9, an electronic device 600 according to a sixth embodiment of the present disclosure may include a circuit layer 110, an electronic element 120, a first flow-path structure 160 and a fluid material 170. The circuit layer 110, the electronic element 120 and the first flow-path structure 160 may constitute a package unit PU, and the electronic device 600 may include a plurality of package units PU, but not limited herein. The electronic element 120 is disposed on the circuit layer 110 and electrically connected to the circuit layer 110. The first flow-path structure 160 includes a first flow path P1, and the electronic element 120 is disposed in the first flow-path structure 160. Furthermore, the first flow-path structure 160 includes an input hole 160I and an output hole 160T, and the fluid material 170 may enter the first flow path P1 through the input hole 160I and exit the first flow path P1 through the output hole 160T, so that the fluid material 170 may be disposed in the first flow path P1 and exchange heat with the electronic element 120 by a convection method, thereby improving the heat dissipation efficiency of the electronic device 600.

In some embodiments, the first flow-path structure 160 may include a substrate 162, and the substrate 162 includes the input hole 160I and the output hole 160T. Specifically, the substrate 162 is disposed corresponding to the electronic element 120, and the electronic element 120 is disposed between the substrate 162 and the circuit layer 110. The input hole 160I and the output hole 160T of the substrate 162 may penetrate through the substrate 162, and the input hole 160I and the output hole 160T may be respectively adjacent to the opposite two sides of the electronic element 120 when viewed from the top in the direction Y, so that the fluid material 170 in the first flow path P1 may form convection shown by the dotted arrows in FIG. 9, thereby performing heat exchange with the electronic element 120. In some embodiments, the first flow-path structure 160 may include the substrate 162 and a support member 164, the substrate 162 includes the input hole 160I and the output hole 160T, and the detail structures and materials thereof may be referred to illustration of the previous embodiments, which will not be described redundantly herein.

In some embodiments, as shown in FIG. 9, the electronic device 600 may further include a circuit board 180 and a second flow-path structure 190, and the second flow-path structure 190 may include a substrate 192 and a support member 194. On the other hand, the electronic device 600 may optionally include a protective layer 210. The detail structures and materials of the above elements may be referred to illustration of the previous embodiments, which will not be described redundantly herein.

From the above description, according to the electronic devices of the embodiments of the present disclosure, the heat transfer efficiency and heat dissipation efficiency of the electronic device may be improved through the structural design of the thermal conducting element, the connection pads, the connectors and/or the conductive elements, or through the structural design of the flow-path structure and the fluid material.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a circuit layer;
an electronic element disposed on the circuit layer and electrically connected to the circuit layer; and
a thermal conducting element disposed between the circuit layer and the electronic element,
wherein the thermal conducting element is used for performing heat exchange with the electronic element,
wherein the electronic element comprises a plurality of connectors, and a size of one of the plurality of connectors is different from a size of another one of the plurality of connectors.

2. The electronic device according to claim 1, wherein the thermal conducting element has a plurality of openings, and the plurality of connectors correspond to the plurality of openings.

3. The electronic device according to claim 2, wherein each of the plurality of connectors is at least partially overlapped with each of the plurality of openings in a top-view direction of the electronic device.

4. The electronic device according to claim 2, wherein an edge of the thermal conducting element is more protruding relative to an edge of the electronic element.

5. The electronic device according to claim 2, further comprising a plurality of connection pads disposed on the circuit layer and electrically connected to the circuit layer, wherein the plurality of connection pads respectively correspond to one of the plurality of openings, and a gap exists between each of the plurality of connection pads and the thermal conducting element.

6. The electronic device according to claim 1, wherein a gap exists between the thermal conducting element and the electronic element in a top-view direction of the electronic device.

7. The electronic device according to claim 1, further comprising a connection pad disposed on the circuit layer and electrically connected to the circuit layer, wherein the plurality of connectors are electrically connected to the connection pad.

8. The electronic device according to claim 7, wherein the thermal conducting element directly contacts with the connection pad.

9. The electronic device according to claim 1, further comprising a plurality of connection pads disposed on the circuit layer and electrically connected to the circuit layer, wherein each of the plurality of connectors is electrically connected to one of the plurality of connection pads.

10. The electronic device according to claim 1, wherein the thermal conducting element comprises a plurality of thermal conducting portions spaced apart from each other.

11. The electronic device according to claim 1, further comprising a plurality of conductive elements disposed on one side of the circuit layer opposite to the electronic element.

12. The electronic device according to claim 11, wherein a size of one of the plurality of conductive elements is different from a size of another one of the plurality of conductive elements.

13. An electronic device, comprising:
a circuit layer;
a connection pad disposed on the circuit layer; and
an electronic element disposed on the circuit layer and electrically connected to the circuit layer,
wherein the electronic element comprises a plurality of connectors, and the plurality of connectors are electrically connected to the connection pad,
wherein a size of one of the plurality of connectors is different from a size of another one of the plurality of connectors.

14. An electronic device, comprising:
a circuit layer;
an electronic element disposed on the circuit layer and electrically connected to the circuit layer; and
a first flow-path structure comprising a first flow path, wherein the electronic element is disposed in the first flow-path structure; and
a fluid material disposed in the first flow path,
wherein the fluid material is used for performing heat exchange with the electronic element,
wherein the first flow-path structure comprises an input hole and an output hole, and the fluid material enters the first flow path through the input hole and exits the first flow path through the output hole.

15. The electronic device according to claim 13, wherein the plurality of connectors are overlapped with the connection pad.

16. The electronic device according to claim 14, wherein the first flow-path structure comprises a substrate, and the substrate comprises the input hole and the output hole.

17. The electronic device according to claim 14, further comprising:
a circuit board electrically connected to the circuit layer; and
a second flow-path structure disposed on the circuit board and comprising a second flow path.

18. The electronic device according to claim 14, further comprising a protective layer, wherein the electronic element comprises a plurality of connectors, and the protective layer covers the plurality of connectors.

* * * * *